(12) United States Patent
Barabi et al.

(10) Patent No.: US 10,094,853 B2
(45) Date of Patent: Oct. 9, 2018

(54) SYSTEMS AND METHODS FOR RELIABLE INTEGRATED CIRCUIT DEVICE TEST TOOLING

(71) Applicant: ESSAI, INC., Fremont, CA (US)

(72) Inventors: Nasser Barabi, Lafayette, CA (US); Hans Dieter Huber, San Ramon, CA (US); Joven R. Tienzo, Fremont, CA (US); Chee Wah Ho, Fremont, CA (US)

(73) Assignee: ESSAI, INC., Fremont, CA (US)

( * ) Notice: Subject to any disclaimer, the term of this patent is extended or adjusted under 35 U.S.C. 154(b) by 2 days.

(21) Appl. No.: 14/810,215

(22) Filed: Jul. 27, 2015

(65) Prior Publication Data

US 2016/0025806 A1    Jan. 28, 2016

Related U.S. Application Data

(60) Provisional application No. 62/030,039, filed on Jul. 28, 2014.

(51) Int. Cl.
*G01R 1/067* (2006.01)
*G01R 1/04* (2006.01)

(52) U.S. Cl.
CPC ....... *G01R 1/06744* (2013.01); *G01R 1/0483* (2013.01)

(58) Field of Classification Search
CPC .. G01R 1/07378; G01R 31/312; G01R 31/04; G01R 1/07314
USPC .... 324/500, 754.01–754.12, 756.01–758.01, 324/690, 696, 715, 724
See application file for complete search history.

(56) References Cited

U.S. PATENT DOCUMENTS

| | | | | |
|---|---|---|---|---|
| 5,929,521 A * | 7/1999 | Wark | ................. | G01R 1/06738 257/692 |
| 8,872,176 B2 * | 10/2014 | Fang | ................. | G01R 1/06744 257/48 |
| 2015/0185249 A1 * | 7/2015 | Hantschel | ............. | G01Q 70/16 850/59 |

* cited by examiner

*Primary Examiner* — Melissa Koval
*Assistant Examiner* — Trung Nguyen
(74) *Attorney, Agent, or Firm* — Kang S. Lim

(57) ABSTRACT

In one embodiment of the present invention, a test probe assembly for testing packaged integrated circuit (IC) devices includes a plurality of probes, a pad and a PCB/interposer. The plurality of probes is configured to repeatedly maintain reliable electrical contact with a corresponding plurality of DUT contacts when under a compliant force. The pad provides mechanical support and/or electric coupling for the plurality of probes. In turn, the PCB/interposer supports the pad. In some embodiments, the plurality of probes includes a hard core material such as diamond. In other embodiments, the surface of the probes is hardened.

14 Claims, 2 Drawing Sheets

SYSTEMS AND METHODS FOR RELIABLE INTEGRATED CIRCUIT DEVICE TEST TOOLING

CROSS REFERENCE TO RELATED APPLICATIONS

This non-provisional application claims the benefit of provisional application no. 62/030,039, filed Jul. 28, 2014, which application is incorporated herein in its entirety by this reference.

BACKGROUND

The present invention relates to systems and methods for reliable test tooling for packaged integrated circuits (IC) devices. In particular, improved contact probes for IC device test tooling is provided.

Current test socketing solutions for packaged IC devices have been subjected to deviation and inconsistency in penetration capability and electrical continuity due to life cycle wear and tear stresses. These unavoidable effects have continue to instigate invalid test failures, higher retest rates, higher test tooling down time and resulting higher IC device test costs.

In general, existing IC device test tooling cost of ownership (CoO) remains high as their life cycle can typically reach 100,000-500,000 practically, depending on IC device testing environment, IC device solder balls quality, contamination and oxidation rate, and other negatively influencing factors such as economic pressure for lower cost IC devices.

Presently, contact probes of test tooling for testing IC devices are generally made from conductive metals and metallic alloys such as BeCu, brass and steel alloys. Depending on the specific applications, these contact probes can also be coated and/or plated with a suitable conductive material such as gold, iridium, nickel, palladium and cobalt.

However, during repetitive testing of the IC devices, e.g., after 100,000 test cycles, the tips of these contact probes of the test tooling have been impacted continually by the solder balls of the IC devices under test. As a result, the contact probe tips are often subjected to contact point deformation, plated conductive layer peel-off, metal oxidation, foreign material adhesion, leading to substantive contact capability degradation.

Furthermore, after repeated continual testing of IC devices described above, the penetration capability of the test tooling contact probes are also affected by the substantial loss of inherent compliant force generated by spring or elastic elements housed by the corresponding contact probe body or column. This problem is exacerbated by IC devices' reduced contact pitch sizes, e.g., from 1.27 mm to 0.2 mm or less.

It is therefore apparent that an urgent need exists for improved reliability for contact probes of IC test tooling after repeated testing. This improved contact probes enables reliable testing of the ever shrinking IC devices for extended periods without any unnecessary downtime of IC test tooling associated with failure or substantial degradation of contact probes.

SUMMARY

To achieve the foregoing and in accordance with the present invention, systems and methods for reliable testing of packaged integrated circuit (IC) devices is provided.

In one embodiment, a test probe assembly is configured for testing packaged integrated circuit (IC) devices. The test probe assembly includes a plurality of probes, a pad and a PCB/interposer. The plurality of probes is configured to repeatedly maintain reliable electrical contact with a corresponding plurality of DUT contacts when under a compliant force. The pad provides mechanical support and/or electric coupling for the plurality of probes. In turn, the PCB/interposer supports the pad.

In some embodiments, the plurality of probes include a hard core material such as diamond. In other embodiments, the surface of the probes is hardened.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which.

DETAILED DESCRIPTION

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "will," "will not," "shall," "shall not," "must," "must not," "first," "initially," "next," "subsequently," "before," "after," "lastly," and "finally," are not meant to limit the scope of the present invention as the embodiments disclosed herein are merely exemplary.

Figure 1:
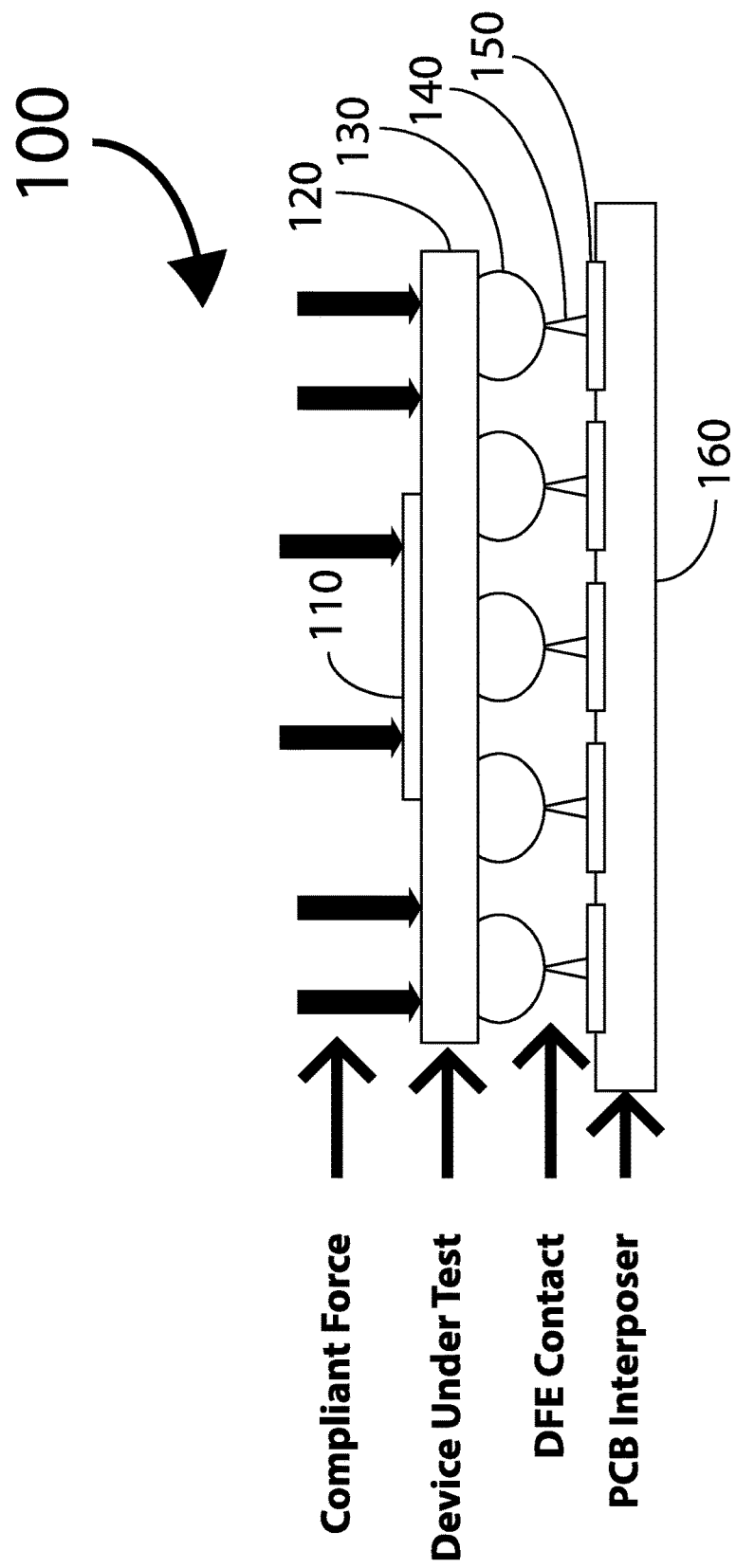
FIG. 1 is a cross-sectional view illustrating an integrated device under test via a plurality of exemplary test probes, in accordance with one embodiment of the present invention.
Figure 2:
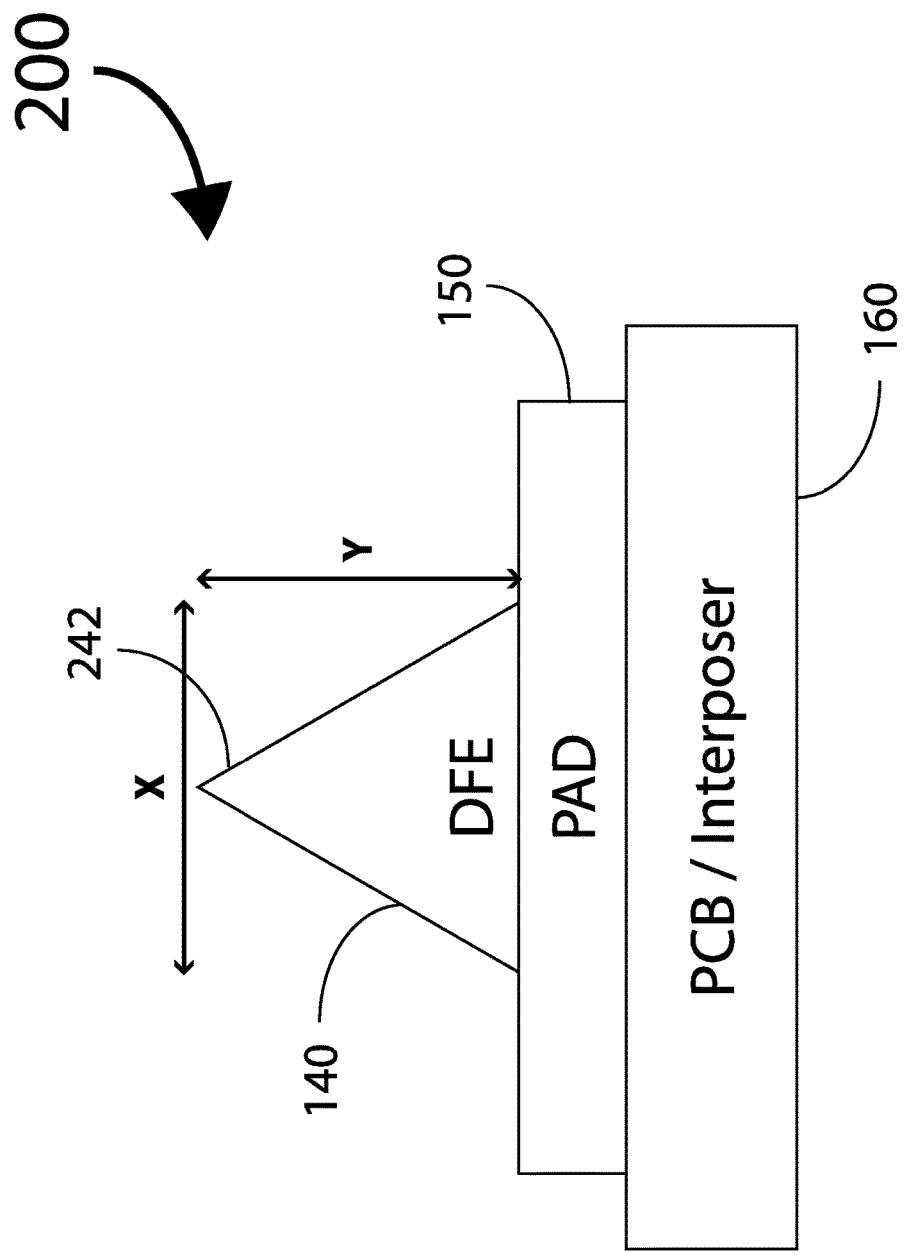
FIG. 2 is an enlarged cross-sectional view of one of the test probes of FIG. 1.

The present invention relates to systems and methods for improved contact probes of reliable test tooling for packaged Integrated Circuits (IC) devices. To facilitate discussion, FIG. 1 is a cross-sectional view illustrating an IC device have a plurality of solder balls under test via a plurality of contact probes, which FIG. 2 is a more detailed view illustrating one embodiment of one of the plurality of contact probes of FIG. 1, in accordance with the present invention.

In this embodiment, the IC device test tooling includes a probe 140 is supported by a pad 150 which in turn is supported by a PCB interposer 160. A typical packaged Device Under Test (DUT) 120 includes an integrated circuit 110 electrically coupled to a plurality of solder balls, e.g., ball 130, located at a bottom surface of the DUT 120. A compliant force is exerted downwards to maintain pressure between the DUT 120 and the PCB interposer 160, thereby ensuring reliable electrical contact between, for example, solder ball 130 and probe 140.

Note that solder ball 130 is exemplary and can be substituted by a variety of suitable alternate shapes, including solder bump, solder pad. Solder ball 130 can also be substituted by a variety of suitable materials with the desired conductivity, melting point, and adhesion and flow characteristics.

Probe 140 should include a core that is resistant to deformation under numerous repeated contact under pressure with materials such as solder. Ideally, the core of probe 140 should have inherent electrically conductive properties. In some embodiments, probe 140 can acquire appropriate conductive properties via, for example, metallurgical fusion with another suitable material. Hence, probe 140 can include a Direct Fit Element (DFE) such as an industrial diamond with a substantially pointed contact tip 242.

In this embodiment, the width (W) and height (H) of probe 140 are both approximately 12.5 um to 635 um. A one-to-one W-to-H aspect ratio may not be a requirement. As discussed above, core of probe 140 can be manufactured from one or more suitable element, compound or composite material with suitable hardness and conductivity properties, including but not limited to diamond, tungsten compounds such as tungsten carbide, nano tubes, ceramics and graphene. It is also possible to employ nano technology, such as nano-growth techniques. The center of probe 140 can be solid, hollow or honeycomb.

In some embodiments, probe 140 is secured to PAD 150 using one or more suitable methods to ensure robust adhesion and/or electrical conductivity, such as mechanical fitting/bracing, soldering and brazing. PCB or interposer 160 can be substantially flat or shaped to confirm to the DUT profiles.

In this embodiment, by avoiding the use of moving parts, the assembly of probe 140, pad 150 and PCB/interposer 160 is less susceptible to wear and tear, sub-assembly tolerances/variations, mechanical damage, mishandling induced damage and long-term functional consistency.

To avoid catastrophic damage to the DUTs, actuation mechanism for delivering compliant contact force and proper solder ball alignment between solder balls and probes, e.g., between ball 130 and probe 140, should be dedicated and consistently precise.

Many modifications and additions to the above described embodiments are also possible to accomplish/enhance the desired design characteristics discussed above. For example, one or more these methodologies may be employed in the manufacture of probe 140, including metallurgical fusion, 3-D printing, electroplating, vapor deposition, chemical bonding, ultrasonic bonding, surface hardening, annealing, resins and electro particle bombardment.

While this invention has been described in terms of several embodiments, there are alterations, modifications, permutations, and substitute equivalents, which fall within the scope of this invention. Although sub-section titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A test probe assembly useful for testing packaged integrated circuit (IC) devices, the test probe assembly comprising:
   a plurality of singular probes configured to repeatedly maintain electrical contact with a corresponding plurality of DUT contacts when under a compliant contact force, each of the plurality of probes having a core that does not deform under repeated contact with the corresponding plurality of DUT contacts under pressure, and wherein the compliant contact force delivered to DUT ensures proper alignment between the DUT contacts and the probes thereby avoiding damage to the DUT;
   a low-profile pad configured to directly support the plurality of probes;
   a PCB configured to support the pad; and
   wherein the compliant contact force delivered to the DUT ensures proper alignment between the DUT contacts and the probes thereby avoiding damage to the DUT.

2. The test probe assembly of claim 1 wherein the core includes a diamond material.

3. The test probe assembly of claim 1 wherein the core is electrically conductive.

4. The test probe assembly of claim 1 wherein each of the plurality of probes includes a conductive surface.

5. The test probe assembly of claim 1 wherein each of the plurality of probes includes a conductive tip.

6. A test probe assembly useful for testing packaged integrated circuit (IC) devices, the test probe assembly comprising:
   a plurality of singular probes configured to repeatedly maintain electrical contact with a corresponding plurality of DUT contacts when under a compliant contact force, each of the plurality of probes having a conductive surface that does not deform under repeated contact with the corresponding plurality of DUT contacts under pressure;
   a low-profile pad configured to directly support the plurality of probes;
   a PCB configured to support the pad; and
   wherein the compliant contact force delivered to the DUT ensures proper alignment between the DUT contacts and the probes thereby avoiding damage to the DUT.

7. The test probe assembly of claim 6 wherein the conductive surface includes a diamond material.

8. The test probe assembly of claim 1 wherein a center of each of the plurality of probes is solid.

9. The test probe assembly of claim 1 wherein a center of each of the plurality of probes is hollow.

10. The test probe assembly of claim 1 wherein a center of each of the plurality of probes is honeycomb.

11. The test probe assembly of claim 1 wherein each of the probes includes a Direct Fit Element (DFE) with a pointed contact tip.

12. The test probe assembly of claim 11 wherein the DFE includes industrial diamond.

13. The test probe assembly of claim 1 wherein the core includes at least one of a tungsten compound, nano-tubes, a ceramic and graphene.

14. The test probe assembly of claim 1 wherein a width and a height of each of the plurality of probes ranges from approximately 12.5 um to 635 um.

\* \* \* \* \*